United States Patent
Wu et al.

(10) Patent No.: US 7,090,965 B2
(45) Date of Patent: *Aug. 15, 2006

(54) METHOD FOR ENHANCING ADHESION BETWEEN REWORKED PHOTORESIST AND UNDERLYING OXYNITRIDE FILM

(75) Inventors: Wen-Bin Wu, Taoyuan (TW); Yuan-Shan Wu, Taoyuan (TW); Yi-Nan Chen, Taipei (TW); Teng-Yen Huang, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 254 days.

This patent is subject to a terminal disclaimer.

(21) Appl. No.: 10/611,196

(22) Filed: Jul. 1, 2003

(65) Prior Publication Data
US 2004/0202964 A1  Oct. 14, 2004

(30) Foreign Application Priority Data
Apr. 8, 2003  (TW) .............................. 92107990 A

(51) Int. Cl.
*G03F 7/00* (2006.01)
(52) U.S. Cl. ...................... 430/313; 430/311; 430/327; 430/329
(58) Field of Classification Search ................ 430/311, 430/313, 327, 329
See application file for complete search history.

(56) References Cited

U.S. PATENT DOCUMENTS

| | | | | |
|---|---|---|---|---|
| 5,368,977 A | * | 11/1994 | Yoda et al. ................. 430/190 |
| 5,443,998 A | * | 8/1995 | Meyer ........................ 438/439 |
| 5,482,174 A | | 1/1996 | Namiki et al. ................ 216/41 |
| 6,143,652 A | * | 11/2000 | Yu .............................. 438/660 |
| 6,174,816 B1 | | 1/2001 | Yin et al. .................... 438/705 |
| 6,218,085 B1 | | 4/2001 | Molloy et al. .............. 430/329 |
| 6,225,219 B1 | | 5/2001 | Lee et al. .................... 438/671 |
| 2001/0045646 A1 | | 11/2001 | Shields et al. .............. 257/734 |
| 2002/0009595 A1 | | 1/2002 | Hong et al. ................. 428/413 |
| 2002/0031726 A1 | | 3/2002 | Hsieh et al. ................. 430/312 |
| 2002/0105728 A1 | | 8/2002 | Yamaguchi et al. ........ 359/580 |
| 2002/0123161 A1 | | 9/2002 | Ushiki et al. ................. 438/14 |
| 2003/0087518 A1 | | 5/2003 | Chen et al. ................. 438/637 |
| 2004/0079729 A1 | * | 4/2004 | Chen et al. ................... 216/86 |
| 2004/0081923 A1 | * | 4/2004 | Wu et al. .................... 430/329 |

OTHER PUBLICATIONS

Larry F. Thompson et al, *Introduction to Microlithography, Second Edition*, 1994, ACS Professional Reference Book, pp. 6-7, USA.

* cited by examiner

*Primary Examiner*—Nicole Barreca
(74) *Attorney, Agent, or Firm*—Quintero Law Office

(57) ABSTRACT

A method for enhancing adhesion between a reworked photoresist and an underlying oxynitride film. A photoresist pattern layer is formed on an oxynitride layer overlying a substrate. The photoresist pattern layer is removed by acidic solution or oxygen-containing plasma. A surface treatment is performed on the oxynitride layer using a development solution to repair the damaged oxynitride layer due to removing the overlying photoresist pattern layer. A reworked photoresist pattern layer is formed on the oxynitride layer.

16 Claims, 3 Drawing Sheets

METHOD FOR ENHANCING ADHESION BETWEEN REWORKED PHOTORESIST AND UNDERLYING OXYNITRIDE FILM

BACKGROUND OF THE INVENTION

1. Field of the Invention

The present invention relates in general to photolithography. More particularly, it relates to a method for enhancing adhesion between a reworked photoresist and an underlying oxynitride film to avoid the reworked photoresist having line/space pattern collapse.

2. Description of the Related Art

As semiconductor manufacturers have sought to fabricate devices with a higher degree of circuit integration to improve device performance, it has become necessary to use photolithography with shorter wavelengths in the mid and deep UV spectra to achieve fine features. In the process of making the desired very fine patterns, many optical effects are experienced which lead to distortion or displacement of images in the photoresist that are directly responsible for wiring line width variations, opens, and shorts, all of which can lead to deteriorated device performance. Many of these optical effects are attributable to substrate geometry and reflectivity influences that include halation and other reflected light scattering effects which may occur due to uneven topography or the varying (wavelength dependent) reflectivity of the substrates and wires or layers being patterned thereon to define the desired features. Such effects are further exacerbated by both the non-uniformity of the photoresist film and film thickness. These effects are manifested in lithographic patterns; uneven line width, often with "reflective notching", due to the standing wave effect, and non-vertical pattern sidewalls. Therefore, the application of an anti-reflect coating (ARC) layer has been developed to impede reflection of the light source and solve the standing wave phenomena.

In order to define very fine patterns, such as shallow trenches and contacts, the aspect ratio (AR) of the patterns, such as line/space patterns, in a photoresist layer is becoming higher.

However, critical dimension (CD) variations frequently occur in a photoresist pattern layer due to the high AR. Thus, a reworked photoresist layer is formed after the photoresist pattern layer is removed by ashing with oxygen-containing plasma. Because the plasma also reacts with the ARC layer, the surface structure of ARC layer is changed, reducing adhesion between the ARC layer and the subsequent reworked photoresist pattern layer.

FIG. 2 is a cross-section showing a collapsing photoresist pattern layer after rework of the prior art. In FIG. 2, a bottom anti-reflection coating (BARC) layer 101, such as silicon oxynitride ($SiO_xN_y$), is disposed on a semiconductor substrate 100. In general, when the CD of the photoresist pattern layer (not shown) formed overlying the BARC layer 101 is varied, the photoresist pattern layer is removed by, for example, ashing with oxygen-containing plasma for photoresist rework. Meanwhile, the BARC layer 101 is damaged by oxygen-containing plasma, changing the surface structure thereof. As a result, adhesion between the BARC layer 101 and the overlying reworked photoresist pattern layer 103 is reduced, causing the photoresist pattern layer 103 collapse, as shown in FIG. 2.

SUMMARY OF THE INVENTION

Accordingly, an object of the present invention is to provide a novel method for enhancing adhesion between a reworked photoresist and an underlying oxynitride film, which uses a surface treatment for the oxynitride film to enhance adhesion of the photoresist, thereby avoiding photoresist collapse after rework.

According to the object of the invention, a method for enhancing adhesion between a reworked photoresist and an underlying oxynitride film is provided. First, a substrate covered by an oxynitride layer is provided. Next, a first photoresist layer is formed on the oxynitride layer, and then photolithography is performed to form a photoresist pattern layer on the oxynitride layer. Subsequently, the photoresist pattern layer is removed. Next, a surface treatment is performed on the oxynitride layer using a development solution to repair the damaged oxynitride layer due to removing the overlying photoresist pattern layer. Finally, a second photoresist layer is formed on the oxynitride layer, and then photolithography is performed again to form a reworked photoresist pattern layer on the oxynitride layer. In addition, an after development inspection (ADI) is further performed before the photoresist pattern layer is removed.

Moreover, the oxynitride layer can be a silicon oxynitride layer.

Moreover, the photoresist pattern layer can be removed by acidic solution or oxygen-containing plasma.

Moreover, the development solution can be tetramethyl ammonium hydroxide (TMAH) solution which has a concentration of about 2% to 3%. In addition, the surface treatment can be performed at 20° C. to 30° C. for 10 sec to 25 sec.

DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

A preferred embodiment of the present invention is now described with reference to FIGS. 1a to 1e. First, in FIG. 1a, a substrate 10, such as a silicon substrate or other semiconductor substrate, is provided. The substrate 10 may contain a variety of elements, including, for example, transistors, resistors, and other semiconductor elements as are well known in the art. The substrate 10 may also contain other insulating layers or metal interconnect layers. In order to simplify the diagram, a flat substrate is depicted.

Next, a bottom anti-reflection coating (BARC) layer 11 is formed overlying the substrate 10 by conventional deposition, such as chemical vapor deposition (CVD). In the invention, the BARC layer 11 can be oxynitride, such as silicon oxynitride ($SiO_xN_y$), which prevents the standing wave effect or the optical proximity effect in subsequent photolithography. Thereafter, a photoresist layer 13 is coated on the BARC layer 11.

Figure 1A:
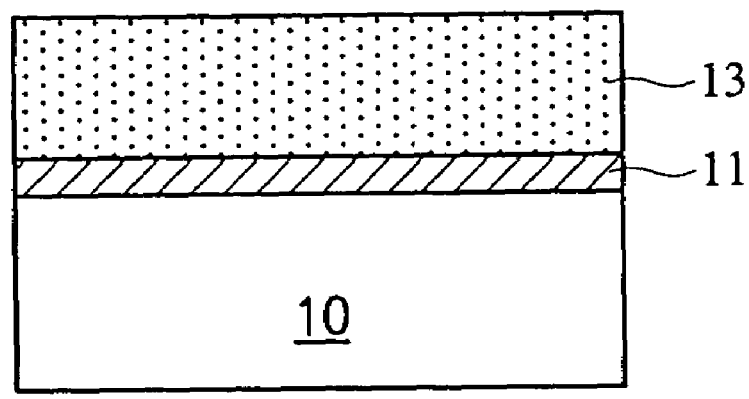
FIGS. 1a to 1e are cross-sections showing a method for enhancing adhesion between a reworked photoresist and an underlying oxynitride film according to the invention.
Figure 1B:
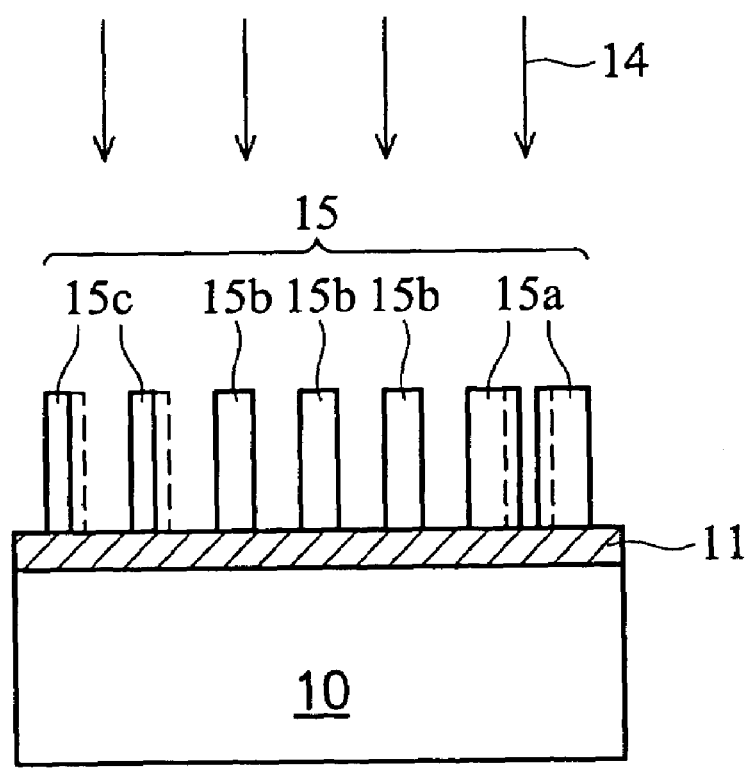

Next, in FIG. 1b, a conventional photolithography is performed on the photoresist layer 13 to form a photoresist layer having a line/space pattern 15 (hereinafter called a photoresist pattern layer) on the BARC layer 11. Next, an after development inspection (ADI) is performed on the photoresist pattern layer 15 to determine whether photoresist rework is required. As mentioned above, after photolithography is performed on the photoresist layer 13, the formed photoresist pattern layer 15 has a high aspect ratio (AR) resulting in the critical dimension (CD) variations. As shown in FIG. 1b, the line patterns i5a, 15c depict line patterns having an undesirable CD in the photoresist pattern layer 15. On the contrary, the line pattern 15b depicts a line having a desirable CD in the photoresist pattern layer 15.

Next, the photoresist pattern layer 15 is removed by a suitable acidic solution or ashing with oxygen-containing plasma to perform photoresist rework. Here, the photoresist pattern layer 15 is removed by ashing with oxygen-containing plasma 14.

Figure 1C:
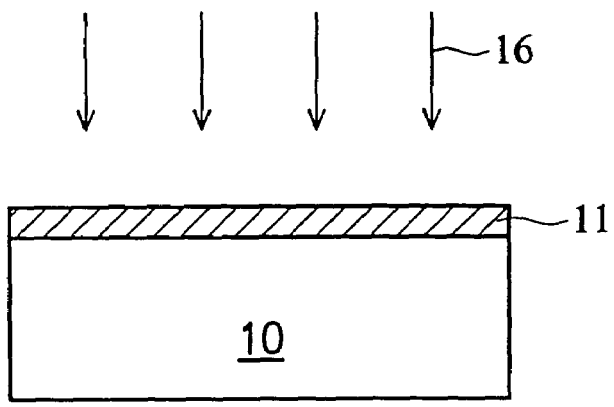

FIG. 1c shows the critical step of the invention. In FIG. 1c, a surface treatment 16 is performed on the BARC layer 11 composed of silicon oxynitride using a development solution. Since the BARC layer 11 is damaged by removing the photoresist pattern layer 15 using oxygen-containing plasma, the initial component of oxygen atoms and nitrogen atoms in the BARC layer 11 is changed. That is, the surface structure of the BARC layer 11 is changed, causing subsequent photoresist rework failure. Accordingly, in the invention, a basic development solution is employed to react with the BARC layer 11, thereby repairing the changed surface structure of the BARC layer 11. Here, the basic development solution can be a tetramethyl ammonium hydroxide (TMAH) solution which has a concentration of about 2% to 3%. Preferably, the concentration is about 2.38%. Moreover, the surface treatment 16 is performed at 20° C. to 30° C. for 10 sec to 25 sec. Preferably, the surface treatment 16 is performed at 23° C. for 15 sec.

Figure 1D:
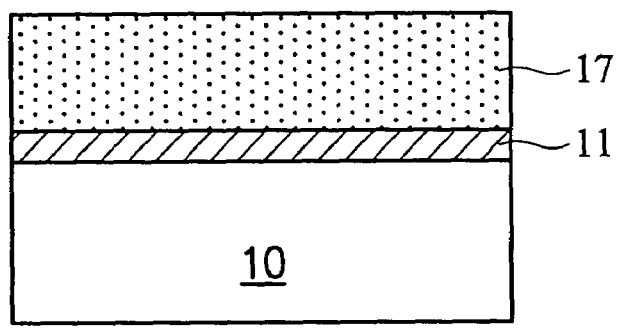
Figure 1E:
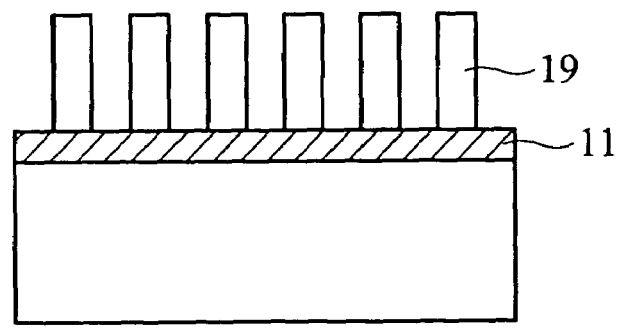
Figure 2:
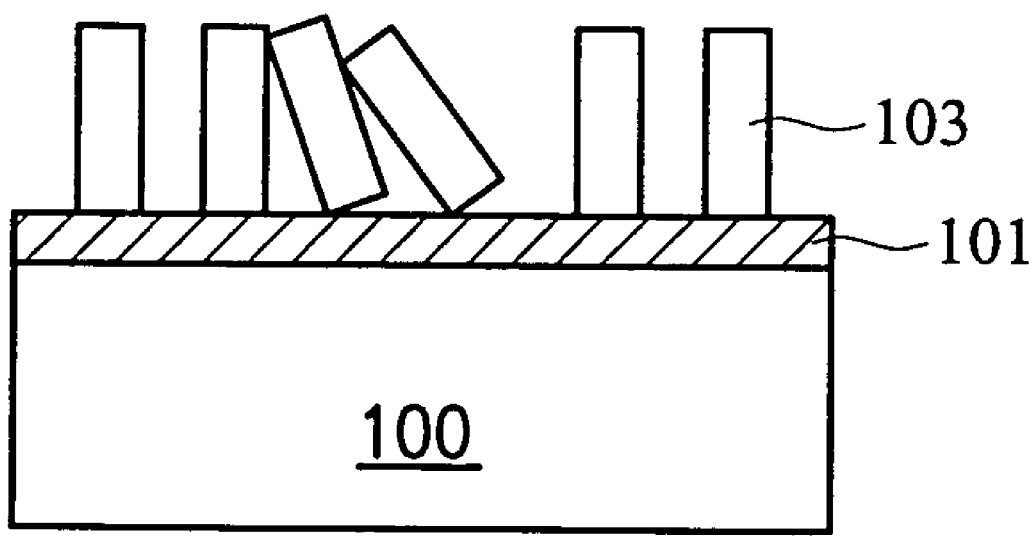
FIG. 2 is a cross-sections showing a collapsing photoresist pattern layer after rework of the prior art.

Next, in FIG. 1d, a photoresist layer 17 is coated on the BARC layer 11 after the surface treatment using the development solution.

Finally, photolithography is performed on the photoresist layer 17 to form a reworked photoresist pattern layer 19 having a line/space pattern on the BARC layer 11.

According to the invention, the BARC layer damaged by the bombardment of oxygen-containing plasma is repaired through the surface treatment using the development solution, thus adhesion between the BARC layer and the overlying photoresist pattern layer is enhanced after photoresist rework. That is, the line patterns collapse problem after photoresist rework can be prevented. In addition, it is noted that if the photoresist pattern layer is removed by acidic solution but not oxygen-containing plasma, the surface treatment using the development solution can neutralize the acidic matter remained on the BARC layer, thereby preventing the reworked photoresist pattern layer from overreacting during photolithography, to avoid line pattern collapse.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for enhancing adhesion between a reworked photoresist and an underlying oxynitride film, comprising the steps of:

providing a semiconductor substrate covered by a silicon oxynitride layer;

forming a first photoresist layer on the silicon oxynitride layer;

performing photolithography on the first photoresist layer to form a photoresist pattern layer on the silicon oxynitride layer;

removing the photoresist pattern layer by oxygen-containing plasma, wherein the silicon oxynitride layer is damaged by using oxygen-containing plasma;

performing a surface treatment on the silicon oxynitride layer using tetramethyl ammonium hydroxide (TMAH) solution to repair the damaged silicon oxynitride layer;

forming a second photoresist layer on the silicon oxynitride layer; and performing photolithography on the second photoresist layer to form a reworked photoresist pattern layer on the silicon oxynitride layer.

2. The method as claimed in claim 1, further performing an after development inspection (ADI) before removing the photoresist pattern layer.

3. The method as claimed in claim 1, wherein the TMAH solution has a concentration of about 2% to %3.

4. The method as claimed in claim 1, wherein the surface treatment is performed at 20° C. to 30° C.

5. The method as claimed in claim 1, wherein the surface treatment is performed for 10 sec to 25 sec.

6. A method for enhancing adhesion between a reworked photoresist and an underlying oxynitride film, comprising the steps of:

providing a substrate covered by an oxynitride layer;

forming a photoresist pattern layer on the oxynitride layer;

removing the photoresist pattern layer, which causes the oxynitride layer damaged;

performing a surface treatment on the oxynitride layer using a development solution to repair the damaged oxynitride layer; and forming a reworked photoresist pattern layer on the oxynitride layer.

7. The method as claimed in claim 6, wherein the substrate is a semiconductor substrate.

8. The method as claimed in claim 6, wherein the oxynitride layer is a silicon oxynitride layer.

9. The method as claimed in claim 6, further performing an after development inspection (ADI) before removing the photoresist pattern layer.

10. The method as claimed in claim 6, wherein the photoresist pattern layer is removed by an acidic solution.

11. The method as claimed in claim 6, wherein the photoresist pattern layer is removed by oxygen-containing plasma.

12. The method as claimed in claim 6, wherein the development solution is tetramethyl ammonium hydroxide (TMAH) solution.

13. The method as claimed in claim 12, wherein the TMAH solution has a concentration of about 2% to %3.

14. The method as claimed in claim 12, wherein the surface treatment is performed at 20° C. to 30° C.

15. The method as claimed in claim 12, wherein the surface treatment is performed for 10 sec to 25 sec.

16. A method for enhancing adhesion between a reworked photoresist and an underlying oxynitride film, comprising the steps of:

providing a semiconductor substrate covered by a silicon oxynitride layer;

forming a first photoresist layer on the silicon oxynitride layer;

performing photolithography on the first photoresist layer to form a photoresist pattern layer on the silicon oxynitride layer;

removing the photoresist pattern layer by oxygen-containing plasma, wherein the silicon oxynitride layer is damaged by using oxygen-containing plasma;

performing a surface treatment on the silicon oxynitride layer using tetramethyl ammonium hydroxide (TMAH) solution with a concentration of about 2% to 3% to repair the damaged silicon oxynitride layer, wherein the surface treatment is performed at 20° C. to 30° C.;

forming a second photoresist layer on the silicon oxynitride layer; and performing photolithography on the second photoresist layer to form a reworked photoresist pattern layer on the silicon oxynitride layer.

\* \* \* \* \*